United States Patent
Zhan et al.

(10) Patent No.: US 7,439,886 B2
(45) Date of Patent: Oct. 21, 2008

(54) VARIABLE-LENGTH DECODER, VIDEO DECODER AND IMAGE DISPLAY SYSTEM HAVING THE SAME, AND VARIABLE-LENGTH DECODING METHOD

(75) Inventors: Jin-Feng Zhan, Yongin-si (KR); Jong-Seon Kim, Seongnam-si (KR); Dong-Yul Lee, Yongin-si (KR); Bom-Yun Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/617,481

(22) Filed: Dec. 28, 2006

(65) Prior Publication Data
US 2007/0182602 A1 Aug. 9, 2007

(30) Foreign Application Priority Data
Dec. 29, 2005 (KR) ............... 10-2005-0133595

(51) Int. Cl.
*H03M 7/40* (2006.01)
(52) U.S. Cl. ............... 341/67; 341/50; 341/51
(58) Field of Classification Search ............ 341/50, 341/51, 67; 714/755; 708/209
See application file for complete search history.

(56) References Cited

U.S. PATENT DOCUMENTS

| | | | | |
|---|---|---|---|---|
| 4,896,353 A | * | 1/1990 | Dehgani et al. | 714/755 |
| 5,173,695 A | * | 12/1992 | Sun et al. | 341/67 |
| 5,557,332 A | * | 9/1996 | Koyanagi et al. | 375/240.16 |
| 5,646,873 A | * | 7/1997 | Shimazawa et al. | 708/209 |
| 5,666,116 A | * | 9/1997 | Bakhmutsky | 341/67 |
| 6,567,019 B2 | | 5/2003 | Nakayama | |
| 6,653,955 B1 | | 11/2003 | Yang | |
| 2005/0174270 A1 | * | 8/2005 | Koo et al. | 341/67 |

FOREIGN PATENT DOCUMENTS

| KR | 1020020019854 A | 3/2002 |
|---|---|---|
| KR | 1020040012403 A | 2/2004 |

OTHER PUBLICATIONS

English Abstract for Publication No.: 1020020019854 A.
English Abstract for Publication No.: 1020040012403 A.

* cited by examiner

*Primary Examiner*—Jean B Jeanglaude
(74) *Attorney, Agent, or Firm*—F. Chau & Associates, LLC (57) ABSTRACT

A variable-length decoder includes a bitstream interface unit and a decoding unit. The bitstream interface unit generates a decoding bitstream for a current decoding process based on an unused decoding bitstream and an input bitstream. The unused bitstream includes unused bits of a previous decoding bitstream. The decoding unit decodes the decoding bitstream to generate a plurality of symbols per clock cycle and provides a next unused bitstream for a next decoding process to the bitstream interface unit.

30 Claims, 8 Drawing Sheets

| CLK | SECOND INPUT REGISTER | FIRST INPUT REGISTER | UNUSED BITSTREAM REGISTER | USED LENGTH | ACC | ACC | CARRY |
|---|---|---|---|---|---|---|---|
| 1 | 00000000 | a0a1a2b0b1c0c1c2 | 0 | 0 | 0 | 0 | 1 |
| 2 | a0a1a2b0b1c0c1c2 | c3d0d1e0e1e2e3f0 | 0 | 0 | 0 | 8 | 1 |
| 3 | a0a1a2b0b1c0c1c2 | c3d0d1e0e1e2e3f0 | b0b1c0c1c2000 | 3 | 3 | 5 | 0 |
| 4 | a0a1a2b0b1c0c1c2 | c3d0d1e0e1e2e3f0 | c0c1c2c3d0d100 | 2 | 5 | 3 | 0 |
| 5 | d0d1e0e1e2e3f00 | f1f2g0g1h0h1i0i1 | d0d1e0e10000 | 4 | 1 | 7 | 1 |
| 6 | d0d1e0e1e2e3f00 | f1f2g0g1h0h1i0i1 | e0e1e2e3f0f100 | 2 | 3 | 5 | 0 |
| 7 | ⋮ | ⋮ | ⋮ | ⋮ | ⋮ | ⋮ | ⋮ |

VARIABLE-LENGTH DECODER, VIDEO DECODER AND IMAGE DISPLAY SYSTEM HAVING THE SAME, AND VARIABLE-LENGTH DECODING METHOD

CROSS-REFERENCE TO RELATED PATENT APPLICATION

This application claims priority to Korean Patent Application No. 2005-133595 filed on Dec. 29, 2005 in the Korean Intellectual Property Office, the disclosure of which is incorporated by reference herein.

BACKGROUND OF THE INVENTION

1. Technical Field

The present disclosure relates to lossless data compression, and more particularly to a variable-length decoder, a video decoder and an image display system having the same and a method of variable-length decoding.

2. Discussion of the Related Art

Typically, a lossless data compressing technology reduces data redundancy. When using a lossless data compressing technology, original data is encoded without any data loss to generate compressed data. The compressed data may be decoded to restore the original data. Lossless compression or lossless coding is referred to as entropy coding. Entropy coding includes fixed-length and variable-length encoding methods.

The variable-length encoding method is widely used in video compression such as in the moving picture experts group (MPEG) and H.261 standards. The variable-length decoding method may be classified into two groups, a tree searching algorithm and a lookup table algorithm.

According to the tree searching algorithm, a code tree is used to determine a codeword and a length of the codeword. The tree searching algorithm has a relatively slow decoding speed.

According to the lookup table algorithm, each codeword corresponds to an entry in the lookup table. The codeword matching the decoded data is searched in the lookup table, and a symbol corresponding to the codeword is determined. One symbol may be generated per clock cycle. The decoding speed of the lookup table algorithm, as compared with the tree searching algorithm, is much faster.

Mobile devices such as cellular phones, personal digital assistants (PDAs) and portable media players (PMPs) are widely used. Such devices need to have low power consumption because battery capacity is limited. Typically, these devices have a high clock speed to enhance their performance, thereby increasing power consumption.

Figure 1:
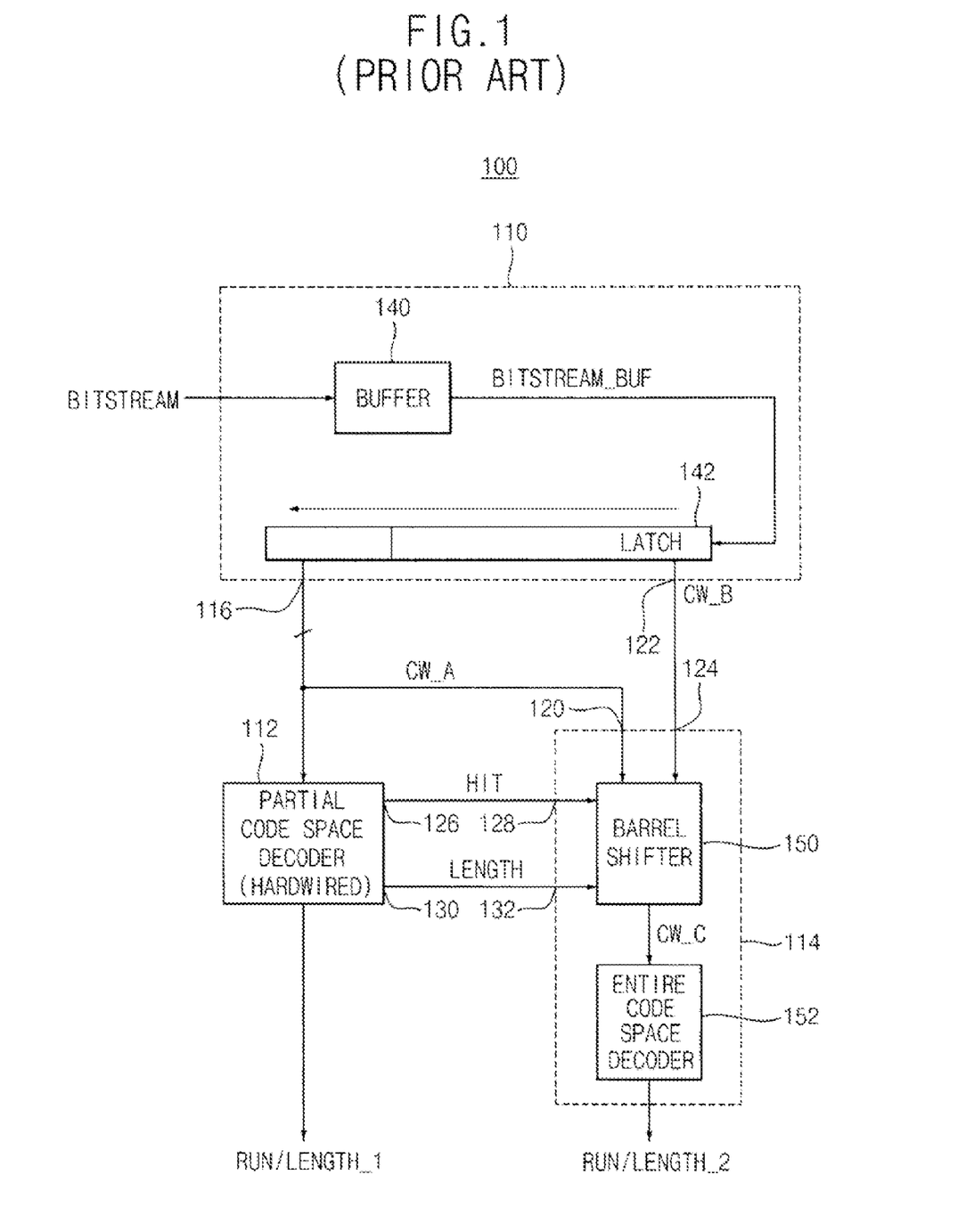
FIG. 1 is a block diagram illustrating a conventional variable-length decoder.

FIG. 1 is a block diagram illustrating a conventional variable-length decoder that is disclosed in U.S. Pat. No. 6,653,955.

In FIG. 1, a variable-length decoder 100 may output two symbols per clock cycle. A partial code space decoder 112 may output one symbol and an entire code space decoder 152 may output the other symbol. However, the variable-length decoder 100 cannot always output two symbols per clock cycle. The variable-length decoder 100 has an irregular data flow and cannot output a uniform number of symbols per clock cycle.

Thus, there is a need for a variable-length decoder which can uniformly output an increased number of symbols to improve decoding speed.

SUMMARY OF THE INVENTION

In an exemplary embodiment of the present invention, a variable-length decoder is provided. The variable-length decoder includes a bitstream interface unit which is configured to generate a decoding bitstream for a current decoding to process based on an unused bitstream and an input bitstream. The unused bitstream includes unused bits of a previous decoding bitstream. The decoding unit is configured to decode the decoding bitstream to generate a plurality of symbols per clock cycle, and configured to provide a next unused bitstream for a next decoding process to the bitstream interface unit.

The bitstream interface unit may receive new bits of a used length from the input bitstream, and combine the unused bits of the previous decoding bitstream and the new bits to generate the decoding bitstream, in which the used length corresponds to a number of used bits of the previous decoding bitstream.

The bitstream interface unit may include a first input register, a first barrel shifter an unused bitstream register, and a logic circuit. The first input register is configured to store the input bitstream. The first barrel shifter is configured to perform a bitwise shift operation on the input bitstream to provide the new bits. The unused bitstream register is configured to store the unused bitstream. The logic circuit is configured to generate the decoding bitstream based on an output of the unused bitstream register and an output of the first barrel shifter.

The bitstream interface unit may further include a second barrel shifter configured to receive the input bitstream from the first input register when the first input register receives a new input bitstream, and configured to perform a bitwise shift operation on the input bitstream to provide the unused bits, and a second input register configured to store an output of the second barrel shifter, in which the logic circuit generates the decoding bitstream based on an additional output of the second input register.

The bitstream interface unit may determine shift numbers of the first and second barrel shifters and a renewal timing of how often the first input register receives a new input bitstream, which is based on the used length, The decoding unit may include a plurality of baseline decoding units coupled in series with each other Each of the baseline decoding units may receive the decoding bitstream including bits that are unused in a previous one of the baseline decoding units, generate a symbol corresponding to a leading codeword of the received decoding bitstream, and output a bit number of the leading codeword.

Each of the baseline decoding units may include a code lookup table, a length tookup table, a barrel shifter, and an adder. The code lookup table provides the symbol corresponding to the leading codeword. The length lookup table provides the bit number of the leading codeword. The barrel shifter is configured to perform a bitwise shift operation on the received decoding bitstream by the bit number of the leading codeword to output the decoding bitstream excluding the leading codeword. The adder is configured to calculate a next used length for the next decoding process by accumulating the bit number of the leading codeword. The next used length corresponds to a number of used bits during the current decoding process.

In an exemplary embodiment of the present invention, a method of variable-length decoding is provided. The method includes the steps of generating a decoding bitstream for a current decoding process based on an unused bitstream and an input bitstream, generating a plurality of symbols per clock cycle based on the decoding bitstream, and providing a next unused bitstream for a next decoding process. The unused bit stream includes unused bits of a previous decoding bitstream, The next unused bitstream includes unused bits of the decoding bitstream.

Generating the decoding bitstream may include the steps of receiving new bits of a used length from the input bitstream, and combining the unused bits of the previous decoding bitstream and the new bits to generate the decoding bitstream. The used length corresponds to a number of used bits of the previous decoding bitstream.

Generating the plurality of symbols may include sequentially generating each of the symbols by a unit of a codeword.

In an exemplary embodiment of the present invention, a video decoder is provided. The video decoder includes an inverse quantization unit, an inverse conversion unit, a motion compensator, and a variable-length decoder. The inverse quantization unit is configured to perform an inverse quantization operation on video data to generate a conversion coefficient. The inverse conversion unit is configured to perform an inverse conversion operation on the conversion coefficient to generate a residual frame The motion compensator is configured to generate a reconstructed video frame based on a reference frame and motion vectors. The variable-length decoder is configured to perform a variable-length decoding process on a bitstream to generate the video data and the motion vectors.

The variable-length decoder includes a bitstream interface unit and a decoding unit. The variable-length decoder is configured to generate a decoding bitstream for a current decoding process based on an unused bitstream and an input bitstream. The unused bitstream includes unused bits of a previous decoding bitstream. The decoding unit is configured to decode the decoding bitstream to generate a plurality of symbols per clock cycle, and to provide a next unused bitstream for a next decoding process to the bitstream interface unit.

The bitstream interface unit may receive new bits of a used length from the input bitstream, and combine the unused bits of the previous decoding bitstream and the new bits to generate the decoding bitstream, in which the used length corresponds to a number of used bits of the previous decoding bitstream.

The bitstream interface unit may include a first input register, a first barrel shifter, an unused bitstream register, and a logic circuit. The first input register is configured to store the input bitstream. The first barrel shifter is configured to perform a bitwise shift operation on the input bitstream to provide the new bits. The unused bitstream register is configured to store the unused bitstream. The logic circuit is configured to generate the decoding bitstream based on an output of the unused bitstream register and an output of the first barrel shifter.

The bitstream interface unit may further include a second barrel shifter configured to receive the input bitstream from the first input register when the first input register receives a new input bitstream, and configured to perform a bitwise shift operation on the input bitstream to provide the unused bits, and a second input register configured to store an output of the second barrel shifter, in which the logic circuit generates the decoding bitstream based on an additional output of the second input register.

The bitstream interface unit may determine shift numbers of the first and second barrel shifters and a renewal timing of how often the first input register receives a new input bitstream, which is based on the used length.

The decoding unit may include a plurality of baseline decoding units coupled in series with each other.

Each of the baseline decoding units may receive the decoding bitstream including bits that are unused in a previous one of the baseline decoding units, generate a symbol corresponding to a leading codeword of the received decoding bitstream, and output a bit number of the leading codeword.

Each of the baseline decoding units may include a code lookup table to provide the symbol corresponding to the leading codeword, a length lookup table to provide the bit number of the leading codeword, a barrel shifter configured to perform a bitwise shift operation on the received decoding bitstream by the bit number of the leading codeword to output the decoding bitstream excluding the leading codeword, and an adder configured to calculate a next used length for the next decoding process by accumulating the bit number of the leading codeword. The next used length corresponds to a number of used bits during the current decoding process.

In an exemplary embodiment of the present invention an image display system is provided. The image display includes a receiving unit, a demultiplexer, a video decoder, an encoder, and a display device. The receiving unit is configured to receive a contents program. The demultiplexer is configured to select video data from the contents program. The video decoder is configured to decode the video data to generate a reconstructed video frame based on a variable-length decoding algorithm. The encoder is configured to convert the reconstructed video frame into display data corresponding to the video frame. The display device is configured to display the display data.

The video decoder includes a bitstream interface unit and a decoding unit. The bitstream interface unit is configured to generate a decoding bitstream for a current decoding process based on an unused bitstream and an input bitstream. The unused bitstream includes unused bits of a previous decoding bitstream. The decoding unit is configured to decode the decoding bitstream to generate a plurality of symbols per clock cycle, and to provide a next unused bitstream for a next decoding process to the bitstream interface unit.

The bitstream interface unit may receive new bits of a used length from the input bitstream, and be configured to combine the unused bits of the previous decoding bitstream and the new bits to generate the decoding bitstream, in which the used length corresponds to a number of used bits of the previous decoding bitstream.

The bitstream interface unit may include a first input register, a first barrel shifter, an unused bitstream register, and logic circuit. The first input register is configured to store the input bitstream. The first barrel shifter is configured to perform a bitwise shift operation on the input bitstream to provide the new bits. The unused bitstream register is configured to store the unused bitstream. The logic circuit is configured to generate the decoding bitstream based on an output of the unused bitstream register and an output of the first barrel shifter.

The bitstream interface unit may further include a second barrel shifter. The second barrel shifter is configured to receive the input bitstream from the first input register when the first input register receives a new input bitstream, and to perform a bitwise shift operation on the input bitstream to provide the unused bits. The second input register is configured to store an output of the second barrel shifter. The logic circuit may generate the decoding bitstream based on an additional output of the second input register.

The bitstream interface unit may determine shift numbers of the first and second barrel shifters and a renewal timing of how often the first input register receives a new input bitstream, which is based on the used length.

The decoding unit may include a plurality of baseline decoding units coupled in series with each other.

Each of the baseline decoding units may receive the decoding bitstream including bits that are unused in a previous one of the baseline decoding units, generate a symbol corresponding to a leading codeword of the received decoding bitstream, and output a bit number of the leading codeword.

Each of the baseline decoding units may include a code lookup table, a length lookup table, a barrel shifter, and an adder. The code lookup table provides the symbol corresponding to the leading codeword. The length lookup table provides the bit number of the leading codeword. The barrel shifter is configured to perform a bitwise shift operation on the received decoding bitstream by the bit number of the leading codeword to output the decoding bitstream excluding the leading codeword. The adder is configured to calculate a next used length for the next decoding process by accumulating the bit number of the leading codeword. The next used length corresponds to a number of used bits during the current decoding process.

BRIEF DESCRIPTION OF THE DRAWINGS

The above and other features of the present invention will become readily apparent by describing in detail, exemplary embodiments thereof with reference to the accompanying drawings, in which.

DETAILED DESCRIPTION OF EXEMPLARY EMBODIMENTS

It will be understood that when an element is referred to as being "connected" or "coupled" to another element, it can be directly connected or coupled to the other element or intervening elements may be present. Like numbers refer to like elements throughout.

Hereinafter, exemplary embodiments of the present invention will be explained in detail with reference to the accompanying drawings.

Figure 2:
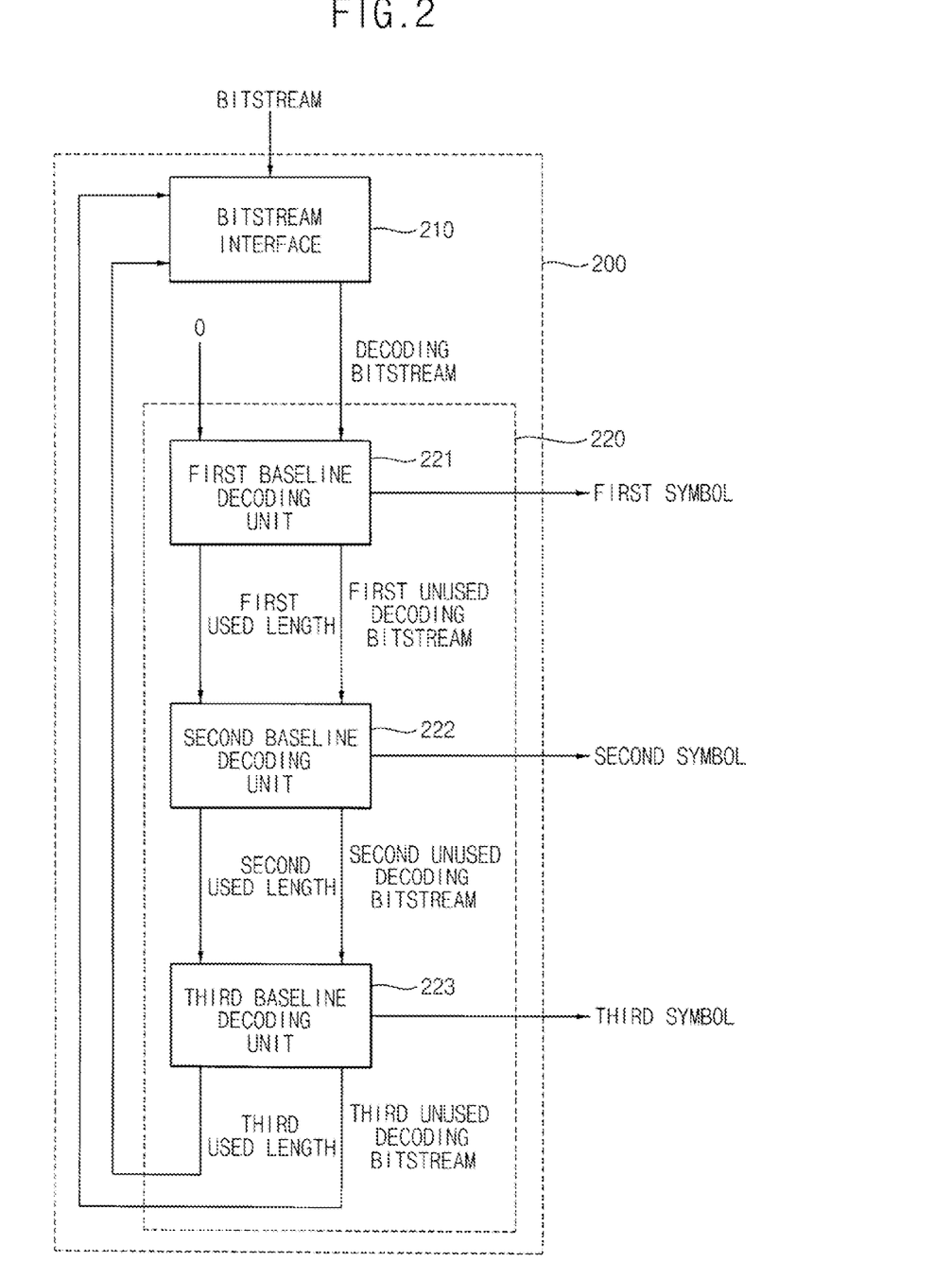
FIG. 2 is a block diagram illustrating a variable-length decoder according to an exemplary embodiment of the present invention.

FIG. 2 is a block diagram illustrating a variable-length decoder according to an exemplary embodiment of the present invention.

Referring to FIG. 2, the variable-length decoder 200 includes a bitstream interface 210 and a decoding unit 220 generating a plurality of symbols per clock cycle.

The bitstream interface 210 generates a decoding bitstream for a current decoding process based on a currently input bitstream, a previously unused decoding bitstream and a used length of a previously used decoding bitstream. A length of the decoding bitstream corresponds to a maximum length which may be decoded in one clock cycle.

The decoding unit 220 includes a plurality of baseline decoding units 221 through 223 that are coupled in series. The number of the baseline decoding units is not limited to three as illustrated in FIG. 2, and may be changed.

Each of the baseline decoding units 221 through 223 generates a single symbol. The symbol indicates original data corresponding to a variable code word included in a variable-length encoded bitstream.

For example, when data represented by 'A', 'B', 'C' and 'D' are encoded by using the variable-length encoding method, the respective variable code words may correspond to '0', '10', '110' and '111'. Therefore, the variable-length encoded bitstream '010011011011100010001000' may be divided into 15 variable code words such as '0', '10', '0', '110', '110', '111''0', '0' '0', '10', '0', '0', '10', '0' and '0', and the bitstream may be represented as 'ABACCDAAABAABAA'.

Each of the baseline decoding units 221 through 223 receives the decoding bitstream including bits that are unused in the previous baseline decoding units. For example, the first baseline decoding unit 221 receives a decoding bitstream output from the bitstream interface 210 and a used length value of '0'. The second baseline decoding unit 222 receives a first decoding bitstream that includes unused bits of the decoding bitstream output from the bitstream interface 210 and a first used length value that indicates a length of a code word used by the first baseline decoding unit 221. The third baseline decoding unit 223 receives a second decoding bitstream that includes unused bits of the first decoding bitstream and a second used length value which indicates a length of code words used by the first and the second baseline decoding units 221 and 222. A third decoding bitstream that includes unused bits of the decoding bitstream by the baseline decoding units 221 through 223 and a third used length value which indicates a length of code words used by the baseline decoding units 221 through 223, are input to the bitstream interface 210.

The decoding unit 220 in FIG. 2 includes three baseline decoding units 221 through 223. However, the number of baseline decoding units may be varied according to a clock frequency of the decoding unit 220. For examples, when the clock frequency of the decoding unit 220 is sufficiently low, the decoding unit 220 may include 24 baseline decoding units to generate 24 symbols per clock cycle.

Although each of the baseline decoding units in FIG. 2 is illustrated as generating a single symbol per clock cycle, the number of symbols generated by the respective baseline decoding units may be varied.

Figure 3:
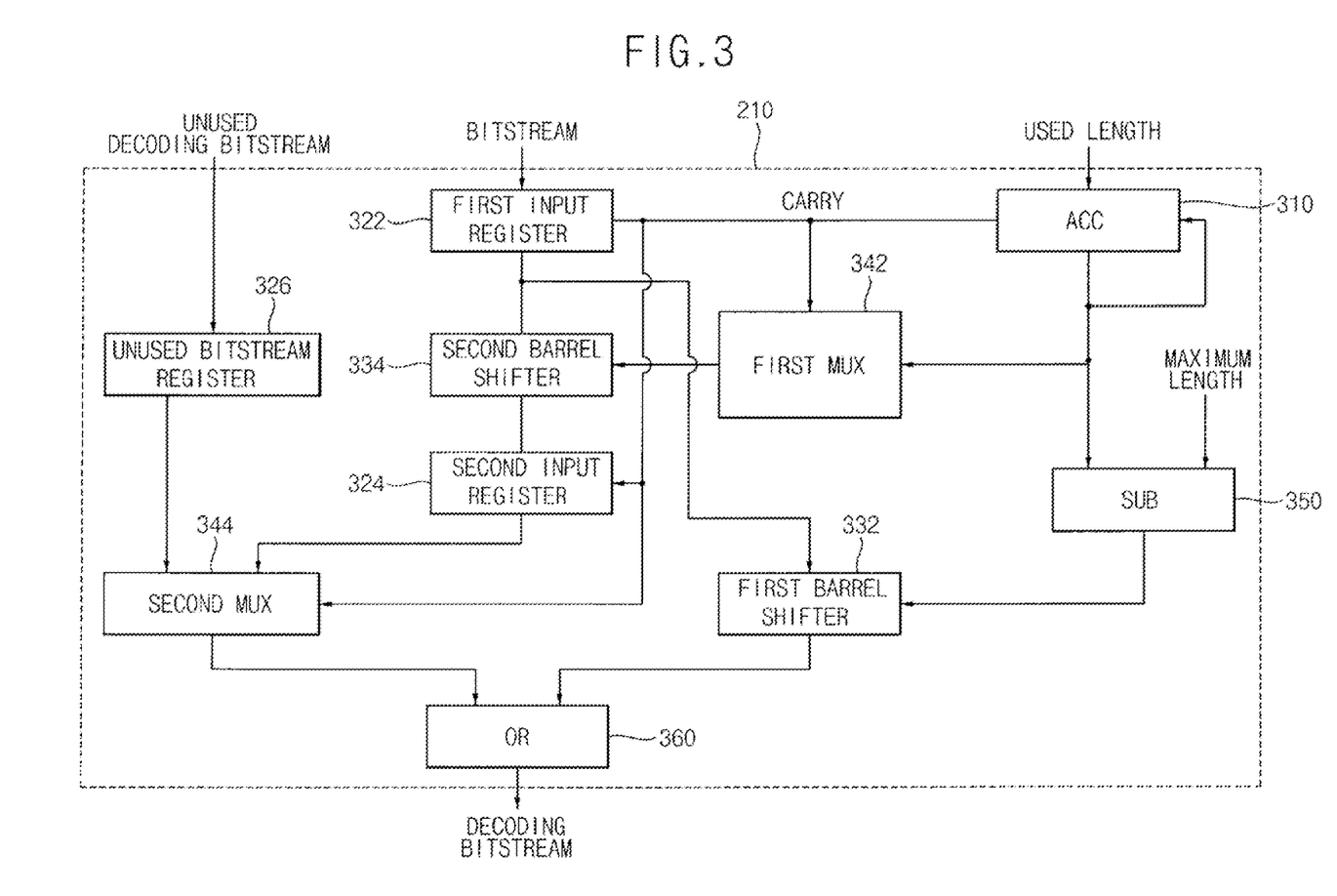
FIG. 3 is a block diagram illustrating an exemplary embodiment of the bitstream interface in FIG. 2.

FIG. 3 is a block diagram illustrating an exemplary embodiment of the bitstream interface in FIG. 2.

The bitstream interface 210 generates a decoding bitstream for a current decoding process based on an unused bitstream and an input bitstream. The unused bitstream includes unused bits of a previous decoding bitstream. Referring to FIG. 3, the bitstream interface 210 may include an accumulator 310, three registers 322, 324 and 326, two barrel shifters 332 and 334, two multiplexers 342 and 344, a subtracter 350, and an OR circuit 360.

The accumulator 310 accumulates the length (i.e., a bit number) of the previously used decoding bitstream to generate a carry signal when the accumulator 310 overflows. The carry signal is activated (e.g., to logic high level) when the contents of the accumulator 310 exceeds the capacity of the accumulator 310. The capacity of the accumulator 310 depends on the size of three registers 322, 324 and 326, and two barrel shifters 332 and 334. For example, when the size of the three registers 322, 324 and 326 respectively corresponds to 256 bits, the accumulator 310 may range in value between 0 and 255.

The carry signal determines whether or not the bitstream interface 210 receives a newly inputted bitstream, thereby generating the decoding bitstream. The bitstream interface unit combines the previously unused decoding bitstream and the currently input bitstream into the decoding bitstream when the carry signal is not activated, and combines the currently inputted bitstream and the newly input bitstream into the decoding bitstream when the carry signal is activated.

When the carry signal output from the accumulator 310 is activated, the first input register 322 outputs a previously stored value to the second barrel shifter 334 and stores the newly input bitstream in response to the carry signal. The first multiplexer 342 outputs a value of the accumulator 310 to the second barrel shifter 334 in response to the carry signal.

The second barrel shifter 334 performs a bitwise shift operation on the previously stored value of the first input register 322 based on the value of the first multiplexer 342. For example, when the first multiplexer 342 has a value of 5, the second barrel shifter 334 may perform a bitwise left shift operation on the previously stored value of the first input register 332 by the value of 5.

The second input register 324 stores a left shifted value of the previously stored value of the first input register 322 (i.e., an output of the second barrel shifter 334) in response to the carry signal and outputs the left shifted value of the previously stored value of the first input register 322 to the second multiplexer 344.

The second multiplexer 344 selects an output of the second input register 324 (i.e., the left shifted value of the previously stored value of the first input register 322) in response to the carry signal to output the left shifted value of the previously stored value of the first input register 322 to the OR circuit 360.

The subtracter 350 subtracts the value of the accumulator 310 from a predetermined maximum length of the decoding bitstream to output the subtracted value to the first barrel shifter 332. The predetermined maximum length of the decoding bitstream may correspond to the size of the three registers 322, 324 and 326, and two barrel shifters 332 and 334.

The first barrel shifter 332 may perform a bitwise right shift operate on the newly inputted bitstream (i.e., a current value of the first input register 322) by the subtracted value to output a right shifted value of the newly input stream to the OR circuit 360.

The OR circuit 360 performs a bitwise OR operation on the left shifted value of the previously stored value of the first input register 322 and the right shifted value of the newly input stream to output the decoding bitstream.

When the carry signal output from the accumulator 310 is not activated, the unused bitstream register 326 stores the previously unused decoding bitstream and outputs the previously unused decoding bitstream to the second multiplexer 344.

The first input register 322 outputs a previously stored value to the first barrel shifter 332 and maintains the previously stored value.

The subtracter 350 subtracts the value of the accumulator 310 from a predetermined maximum length of the decoding bitstream to output the subtracted value to the first barrel shifter 332. The predetermined maximum length of the decoding bitstream may correspond to the size of the three registers 322, 324 and 326, and two barrel shifters 332 and 334.

The first barrel shifter 332 performs a bitwise right shift operation on the previously stored value by the subtracted value to output a right shifted value of the previously stored value to the OR circuit 360.

The OR circuit 360 performs a bitwise OR operation on the previously unused decoding bitstream and the right shifted value of the previously stored value of the first input register 322 to output the decoding bitstream.

Figure 4:
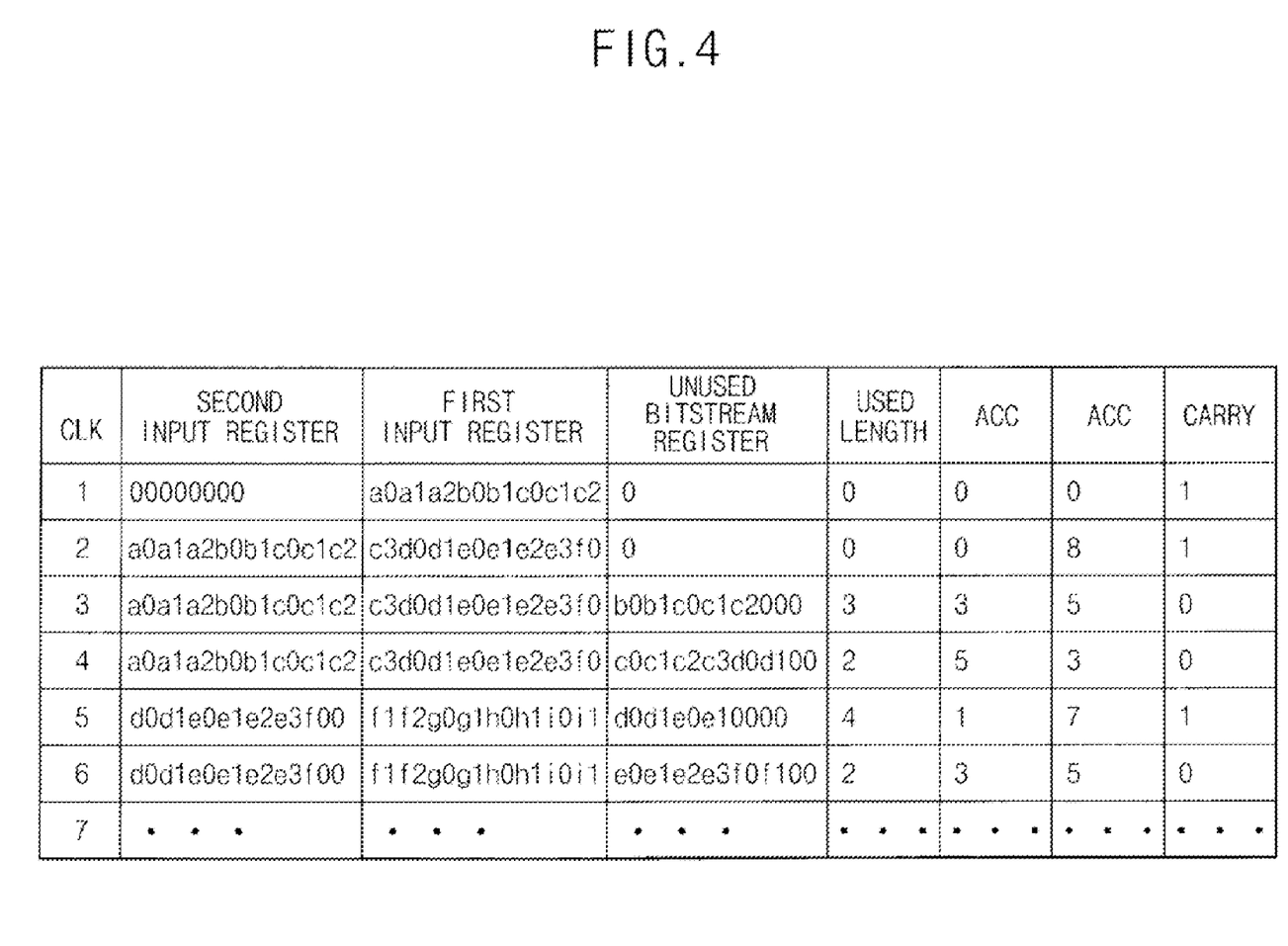
FIG. 4 is a table illustrating an operation of the bitstream interface in FIG. 3.

FIG. 4 is a table illustrating an operation of the bitstream interface in FIG. 3.

In FIG. 4, it is assumed that the size of the three registers corresponds to an 8 bit value, and the second baseline decoding unit 222 includes the first baseline decoding unit 221 so that a single codeword may be decoded per clock cycle. A continuous input bitstream is assumed to be 'a0a1a2b0b1c1c2c3d0d1d0d1e0e1e2e3f0f1f2g0g1h0h1i0i1' in which 'a0a1a2', 'b0b1', 'c0c1c2', 'd0d1', 'e0e1e2e3', 'f0f1f2', 'g0g1', 'h0h1', and 'i0i1' each respectively correspond to a different codeword.

In an initial step, all the three registers 322, 324 and 326 are set to a value of '0' before the bitstream interface 210 receives the input bitstream. During the first two clock cycles, the carry signal is set to a value of '1' so that the first input register 322 may receive a next input bitstream from the continuous input bitstream.

During the first clock cycle, the first input register 322 outputs a previously stored value of '00000000' to the second input register 324 via the second barrel shifter 334 and receives an input bitstream having a value of 'a0a1a2b0b1c0c1c2' in response to the activated carry signal from the accumulator 310.

The second input register 324 stores the previously stored value of the first input register 322 (i.e. a value of '00000000') in response to the activated carry signal.

During the second clock cycle, the first input register 322 outputs the previously stored value of 'a0a1a2b0b1c0c1c2' and receives a new input bitstream having a value of 'c3d0d1e0e1e2e3f0' in response to the activated carry signal.

The second input register 324 stores the previously stored value of the first input register 322 (i e., the value of 'a0a1a2b0b1c0c1c2') in response to the activated carry signal.

The second multiplexer 344 selects a value of the second input register 324 in response to the activated carry signal.

The subtracter 350 subtracts a value of '0' from the predetermined maximum length (i.e., a value of '8') so that the subtracted value corresponds to the value of '8', and the first barrel shifter 332 performs a bitwise right shift operation on a value of the first input register 322 so that the right shifted value of the first input register 322 corresponds to a value of '00000000'.

The OR circuit 310 performs a bitwise OR operation on the value of the second input register 324 (i.e., the value of 'a0a1a2b0b1c0c1c2') and the shift right value of the first input register 322 (i.e., a value of '00000000') to output a decoding bitstream having a value of 'a0a1a2b0b1c0c1c2' to the decoding unit 220.

The decoding unit 220 decodes the decoding bitstream to generate a single codeword (i.e., a leading codeword having a value of 'a0a1a2'), and outputs an unused decoding bitstream (i.e., a value of 'b0b1c0c1c2000') and a used length having a value of '3' for a single codeword having a value of 'a0a1a2'.

During the third clock cycle, the accumulator 310 stores the value of '3'. The unused bitstream register 326 receives a value of 'b0b1c0c1c2000'.

The second multiplexer selects a value of the unused bitstream register 326 in response to the inactivated carry signal from the accumulator 310.

The first input register 322 outputs the previously stored value (i.e., the value of 'c3d0d1e0e1e2e3f0') and maintains the previously stored value in response to the inactivated carry signal.

The subtracter 350 subtracts the used length (i.e., the value of '3') from the predetermined maximum length (ie., the value of '8') to generate the subtracted value (i.e., a value of '5') for output to the first barrel shifter 332.

The first barrel shifter 332 performs a bitwise right shift operation on the previously stored value of the first input register 322 by the subtracted value so that an output of the first barrel shifter corresponds to a value of '00000c3d0d1'.

The OR circuit 360 performs a bitwise OR operation on the value of the second multiplexer 344 (i.e., the value of 'b0b1c0c1c2000') and the value of the first barrel shifter 332 (i.e., a value of '00000c3d0d1') to generate a decoding bitstream having a value of 'b0b1c0c1c2c3d0d1'.

The decoding unit 220 decodes the decoding bitstream to generate a single codeword (i.e., a codeword having a value of 'b0b1') and outputs an unused decoding bitstream (i.e., a value of 'c0c1c2c3d0d100') and a used length having a value of '2' for a single codeword having a value of 'b0b1'.

During the fourth clock, the accumulator 310 stores the value of '5'.

The OR circuit 360 generates a decoding bitstream having a value of 'c0c1c2c3d0d1e0e1' in a way similar to the steps performed during the third clock cycle.

The decoding unit 220 decodes the decoding bitstream to generate a single codeword (i.e., a codeword having a value of 'c0c1c2') and outputs an unused decoding bitstream (i.e., a value of 'd0d1e0e10000') and a used length having a value of '3' corresponding to a bit number of the used codeword 'c0c1c2'.

During the fifth clock, the accumulator 310 overflows and generates the activated carry signal because a value of the accumulator 310 (i.e., a value of '8') is greater than a capacity of the accumulator 310. The accumulator 310 is reset to a value of '1', which corresponds to the value of the accumulator 310 (i.e., a value of '8') modulo a value of the predetermined maximum length subtracting '1' (i.e., a value of '7').

The first input register 322 outputs a previously stored value (i.e., 'c3d0d1e0e1e2e3f0') to the second barrel shifter 334 and receives a new input bitstream having a value of 'f1f2g0g1h0h1i0i1' in response to the activated carry signal.

The second barrel shifter 334 performs a bitwise left shift operation on the previously stored value (i.e., 'c3d0d1e0e1e2e3f0') by a value of the accumulator 310 (i.e., a value of '1') to generate a left shifted value of the first input register 322 (i.e., 'd0d1e0e1e2e3f00') in response to the activated carry signal.

The second input register 324 stores the left shifted value of the first input register 322 (i.e., 'd0d1e0e1e2e3f00') in response to the activated carry signal.

The second multiplexer 344 selects a value of the second input register 324 in response to the carry signal to output the value of the second input register 324 (i.e., 'd0d1e0e1e2e3f00').

The subtracter 350 subtracts the value of the accumulator 310 (i.e., a value of '1') from the predetermined maximum length (i.e., a value of '8') to output the subtracted value (i.e., a value of '7') to the first barrel shifter 332.

The first barrel shifter 332 performs a bitwise right shift operation on the new input bitstream of the first input register 322 (i.e., a value of 'f1f2g0g1h0h1i0i1') by the subtracted value (i.e., a value of '7') so that an output of the first barrel shifter corresponds to a value of '0000000f1'.

The OR circuit 360 performs a bitwise OR operation on the value of the second register 324 (i.e., 'd0d1e0e1e2e3f00') and the right shifted value by the first barrel shifter 332 (i.e., '0000000f1') to output a decoding bitstream having a value of 'd0d1e0e1e2e3f0f1' to the decoding unit 220.

The decoding unit 220 decodes the decoding bitstream to generate a single codeword (i.e., a leading codeword having a value of 'd0d1') and outputs an unused bitstream (i.e., a value of 'e0e1e2e3f0f100') and a used length having a value of '2' corresponding to a bit number of the codeword 'd0d1'.

During the sixth clock cycle, the accumulator 310 stores a value of '3'.

Similar to the steps that occurred during the third clock cycle, the OR circuit 360 generates a decoding bitstream having a value of 'e0e1e2e3f0f1f2g0'.

The decoding unit 220 decodes the decoding bitstream to generate a single codeword (i.e., a leading codeword having a value of 'e0e1e2e3') and outputs an unused bitstream (i.e., a value of 'f0f1f2g00000') and a used length having a value of '4' corresponding to a bit number of the codeword 'e0e1e2e3'.

When a codeword corresponding to a single symbol has a maximum bit number of 8 and the variable-length decoder generates 24 symbols per clock cycle, the registers respectively have 192 bits and the decoding bitstream has 192 bits. Here, the used length may range in value between 24 and 192.

Figure 5:
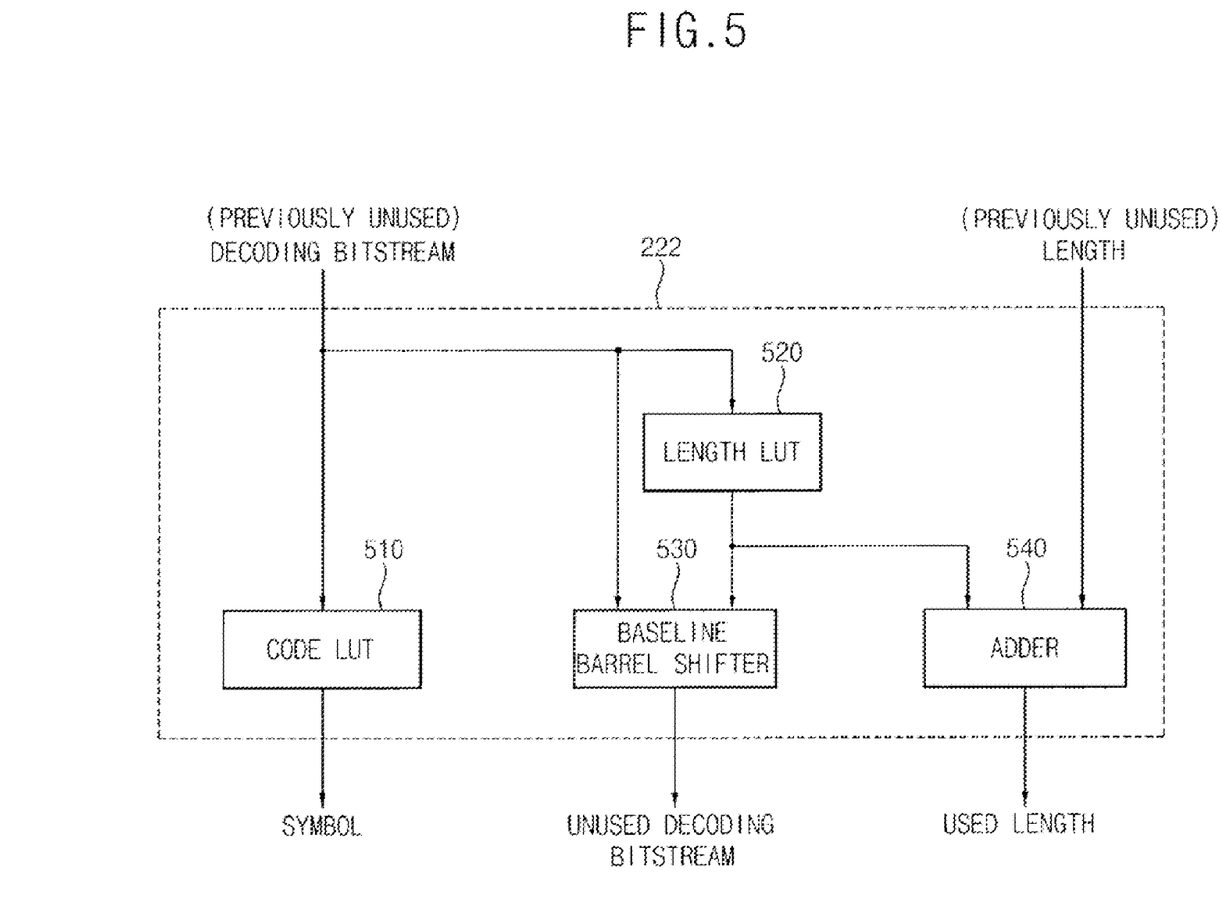
FIG. 5 is a block diagram illustrating an exemplary embodiment of the baseline decoding unit in FIG. 2.

FIG. 5 is a block diagram illustrating an exemplary embodiment of the baseline decoding unit in FIG. 2.

The second baseline decoding unit 222 receives a previously unused decoding bitstream and a previously used length of the decoding stream output from the first baseline decoding unit 221 and outputs a single symbol, an unused decoding bitstream and a used length of the decoding stream (i.e., a length of the single symbol).

Referring to FIG. 5, the baseline decoding unit 222 includes a code lookup table 510, a length lookup table 520, a baseline barrel shifter 530 and an adder 540.

The code lookup table 510 stores a plurality of codewords corresponding to each symbol, and outputs a symbol corresponding to a leading codeword of the previously unused decoding bitstream when the code lookup table 510 receives the previously unused decoding bitstream.

The length lookup table 520 outputs a length of the leading codeword of the previously unused decoding bitstream (i.e., the length corresponds to a bit number of the leading codeword of the previously unused decoding bitstream).

The baseline barrel shifter 530 performs a bitwise left shift operation on the previously unused decoding bitstream by the length of the leading codeword to output a left shifted value of the previously unused decoding bitstream.

The adder 540 adds the length of the leading codeword into the used length of the decoding bitstream.

For example, when letters 'A', 'B', 'C' and 'D' are encoded by using the variable-length encoding method, the respective variable codewords may correspond to '0', '10', '110' and '111', and the previously unused decoding bitstream corresponds to a value of '11001000', then the leading codeword of the previously unused decoding bitstream corresponds to a value of '110'.

The code lookup table 510 outputs a symbol 'C' corresponding to the leading codeword of the previously unused decoding bitstream and the length lookup table 520 outputs a length of the leading codeword (i.e., a value of '3').

The baseline barrel shifter 530 performs a bitwise left shift operation on the previously unused decoding bitstream by the length of the leading codeword (i.e., a value of '3') to output a left shifted value (i.e., a value of '01000000').

The adder 540 adds the length of the leading codeword (i.e., a value of '3') into the previously used length (e.g., a value of '2') to output an added used length (i.e., a value of '5').

Figure 6:
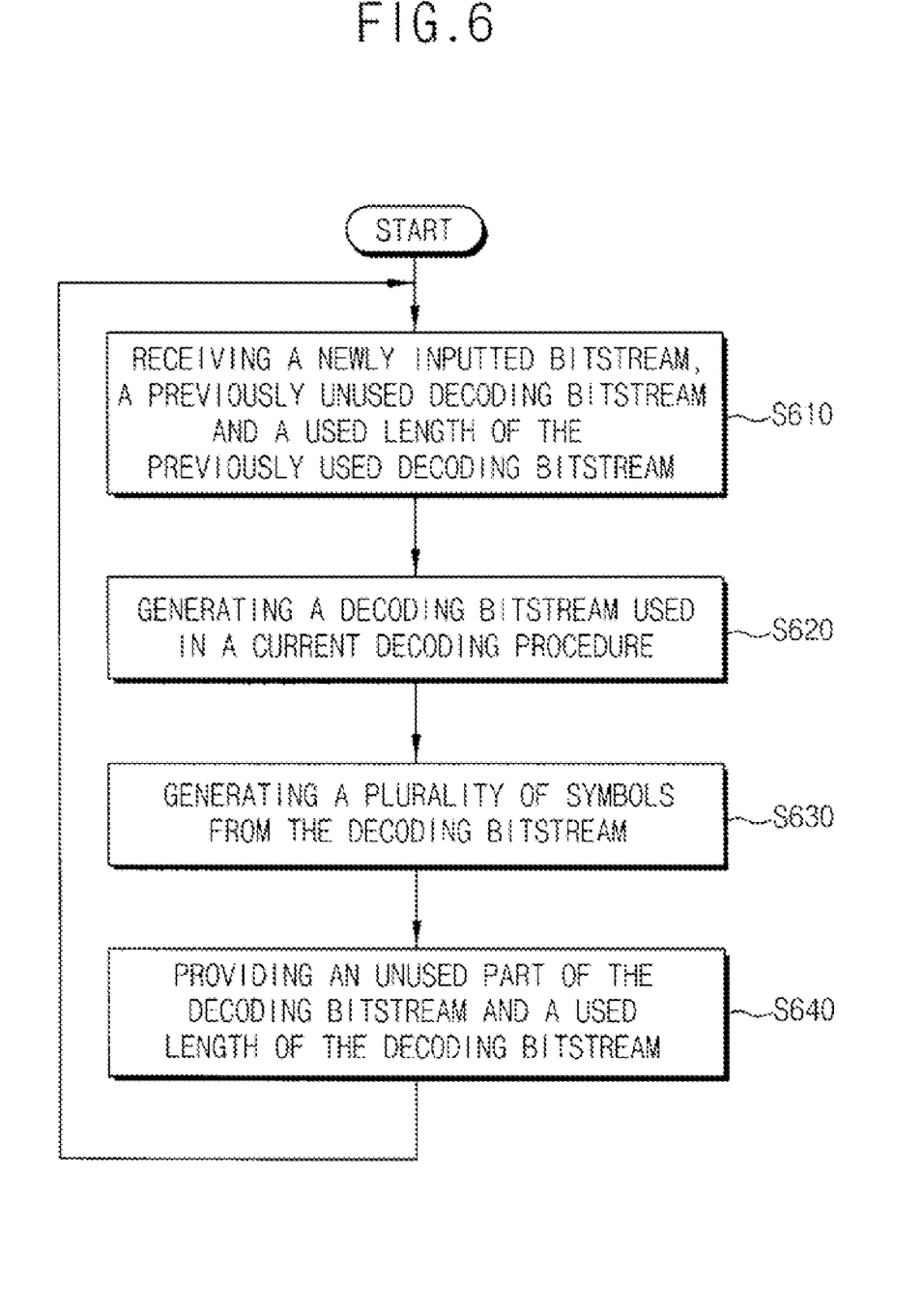
FIG. 6 is a flowchart illustrating a method of variable-length decoding according to an exemplary embodiment of the present invention.

FIG. 6 is a flowchart illustrating a method of variable-length decoding according to an exemplary embodiment of the present invention.

The bitstream interface 210 receives a newly input bitstream, a previously unused decoding bitstream and a used length of the previously used decoding bitstream (Step S610). The newly input bitstream may be provided from an external device of the variable-length decoder 200. The previously unused decoding bitstream and the used length of the previously used decoding bitstream are provided from the decoding unit 220.

The bitstream interface 210 generates a decoding bitstream for a current decoding procedure based on the newly input bitstream, the previously unused decoding bitstream and the used length of the previously used decoding bitstream (Step S620).

The decoding unit 220 generates a plurality of symbols from the decoding bitstream, where each symbol corresponds to a single codeword of the decoding bitstream (Step S630).

The decoding unit 220 provides an unused decoding bitstream for a current decoding procedure and a used length of the decoding bitstream at a current decoding procedure to the bitstream interface (Step S640).

Figure 7:
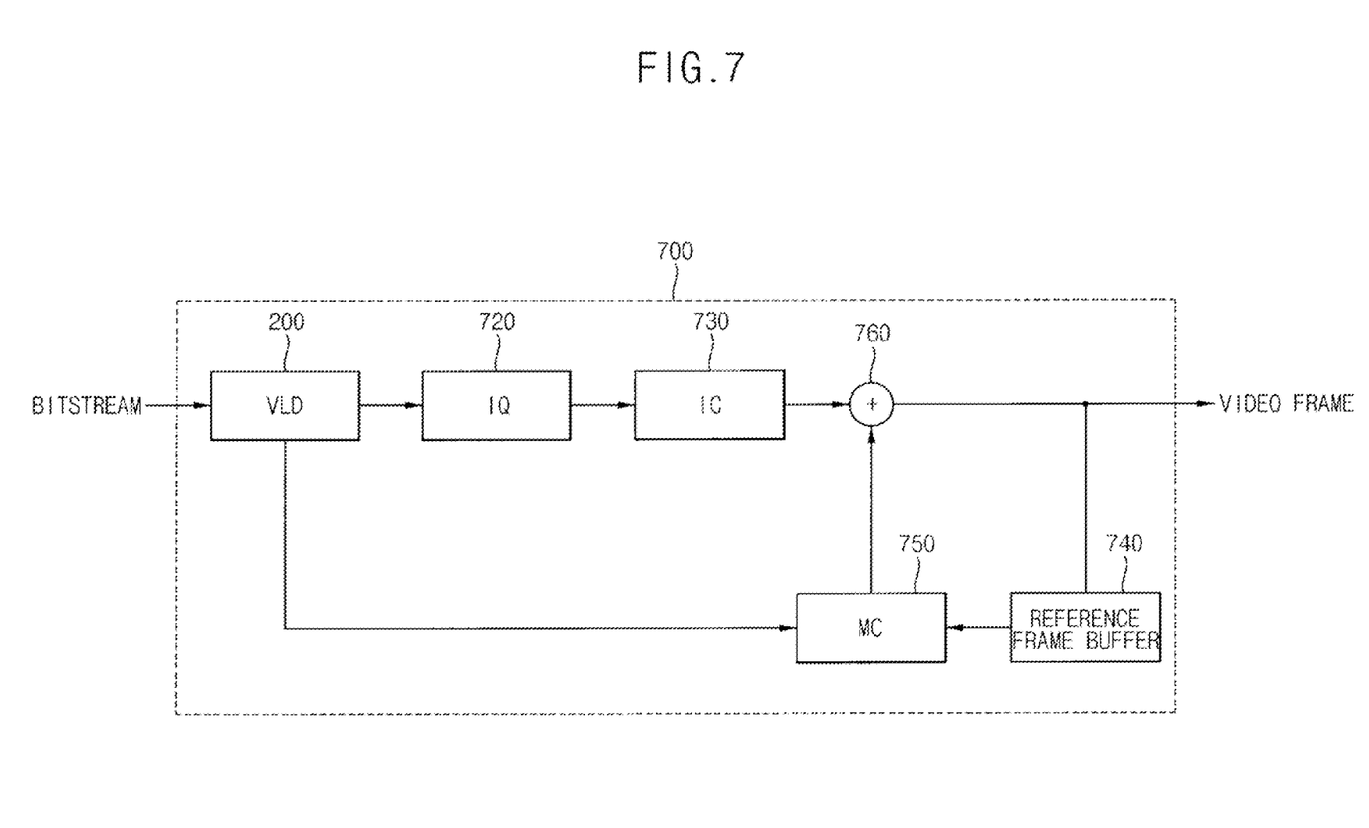
FIG. 7 is a block diagram illustrating a video decoder according to an exemplary embodiment of the present invention.

FIG. 7 is a block diagram illustrating a video decoder according to an exemplary embodiment of the present invention.

Referring to FIG. 7, the video decoder 700 includes the variable-length decoder 200, an inverse quantization unit 720, an inverse converter 730, a reference frame buffer 740, a motion compensator 750 and an adder 760.

The variable-length decoder 200 in FIG. 2 decodes a bitstream to generate a plurality of symbols per clock cycle. The symbols may correspond to video data or a motion vector.

The inverse quantization unit 720 performs an inverse quantization operation on the generated symbols that is quantized to provide a conversion coefficient.

The inverse conversion unit 730 performs a conversion operation on the conversion coefficient to generate a video frame or a residual frame. For example, the conversion operation may include an inverse discrete cosine transform (IDCT) and an inverse wavelet transform. The inverse conversion unit 730 generates the video frame with a conversion coefficient related to inter-frame (i.e., I-frame) and the residual frame with a conversion coefficient related intra-frame (i.e., B-frame, P-frame).

The reference frame buffer 740 stores a reference video frame that is previously reconstructed to help reconstruct a video frame.

The motion compensator 750 uses the reference video frame output from the reference frame buffer 740 and the motion vector output from the variable-length decoder 200 to generate a prediction frame.

The adder 760 adds the generated prediction frame to the residual frame to reconstruct the video frame.

Figure 8:
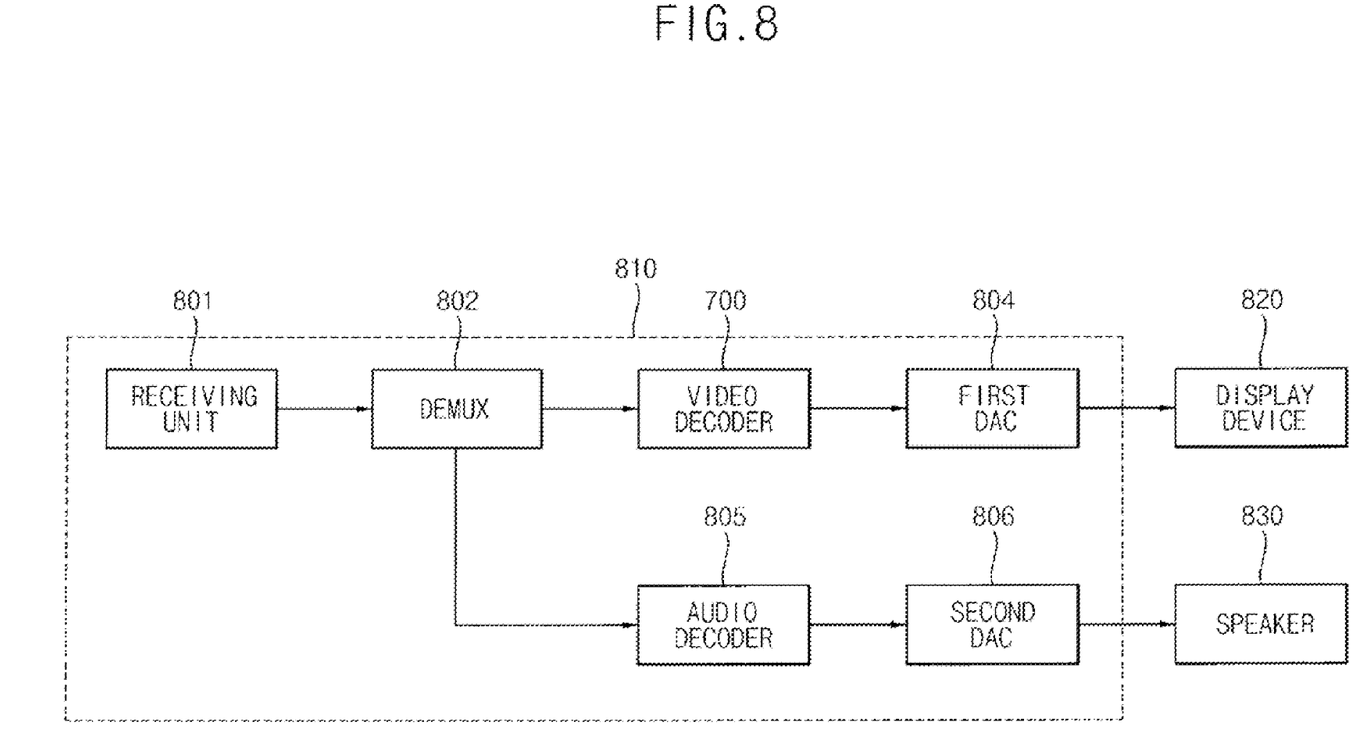
FIG. 8 is a block diagram illustrating a display system according to an exemplary embodiment of the present invention.

FIG. 8 is a block diagram illustrating a display system according to an exemplary embodiment of the present invention.

Referring to FIG. 8, the display system includes an image processing unit 810, a display device 820 and a speaker 830.

The image processing unit 810 includes a receiving unit 801, a demultiplexer 802, the video decoder 700, a first digital to analog converter (DAC) 804, an audio decoder 805, and a second digital to analog converter (DAC) 806.

The receiving unit 801 receives a bitstream including multimedia a content through a wired/wireless channel. For example, the wired channel may include a cable broadcasting system and an Internet broadcasting system, and the wireless channel may include a terrestrial broadcasting system such as a digital multimedia broadcasting (DMB), a digital video broadcasting (DVB) and a satellite broadcasting system.

The demultiplexer 802 selects encoded video data among the bitstream to output the selected encoded video data to the video decoder 700 and selects encoded audio data among the bitstream to output the selected encoded audio data to the audio decoder 805.

The video decoder 700 decodes the selected encoded video data to generate decoded video data and the audio decoder 805 decodes the selected encoded audio data to generate decoded audio data.

The first and the second DACs 804 and 806 respectively convert the decoded video/audio data into corresponding analog data. The display device 820 and the speaker 830 respectively output the converted video/audio data.

As described above, at least one embodiment of the variable-length decoder of the present invention generates a plurality of symbols per clock. Therefore, a system employing such a variable-length decoder may operate at a relatively low clock frequency, thereby reducing power consumption. Such a system may be used in the field of mobile devices.

In an exemplary embodiment of the present invention, the above-described variable-length decoder may use the used length of the previously decoding bitstream in lieu of the unused length of the previously decoding bitstream.

Although exemplary embodiments of the present invention have been described, it is to be understood that the present invention should not be construed as limited to these exemplary embodiments but various changes and modifications can be made by those of ordinary skill in the art within the spirit and scope of the present Invention as hereinafter claimed.

What is claimed is:

1. A variable-length decoder comprising:
   a bitstream interface unit configured to generate a decoding bitstream for a current decoding process based on an unused bitstream and an input bitstream, the unused bitstream including unused bits of a previous decoding bitstream; and
   a decoding unit configured to decode the decoding bitstream to generate a plurality of symbols per clock cycle, and configured to provide a next unused bitstream for a next decoding process to the bitstream interface unit.

2. The variable-length decoder of claim 1, wherein the bitstream interface unit is configured to receive new bits of a used length from the input bitstream, and configured to combine the unused bits of the previous decoding bitstream and the new bits to generate the decoding bitstream, the used length corresponding to a number of used bits of the previous decoding bitstream.

3. The variable-length decoder of claim 2, wherein the bitstream interface unit comprises:
   a first input register configured to store the input bitstream;

a first barrel shifter configured to perform a bitwise shift operation on the input bitstream to provide the new bits;

an unused bitstream register configured to store the unused bitstream; and a logic circuit configured to generate the decoding bitstream based on an output of the unused bitstream register and an output of the first barrel shifter.

4. The variable-length decoder of claim 3, wherein the bitstream interface unit further comprises:

a second barrel shifter configured to receive the input bitstream from the first input register when the first input register receives a new input bitstream, and configured to perform a bitwise shift operation on the input bitstream to provide the unused bits; and a second input register configured to store an output of the second barrel shifter, and wherein the logic circuit generates the decoding bitstream based on an additional output of the second input register.

5. The variable-length decoder of claim 4, wherein the bitstream interface unit is configured to determine shift numbers of the first and second barrel shifters and a renewal timing of how often the first input register receives a new input bitstream, which is based on the used length.

6. The variable-length decoder of claim 1, wherein the decoding unit comprises, a plurality of baseline decoding units coupled in series with each other.

7. The variable-length decoder of claim 6, wherein each of the baseline decoding units is configured to receive the decoding bitstream including bits that are unused in a previous one of the baseline decoding units, configured to generate a symbol corresponding to a leading codeword of the received decoding bitstream, and configured to output a bit number of the leading codeword.

8. The variable-length decoder of claim 7, wherein each of the baseline decoding units comprise:

a code lookup table to provide the symbol corresponding to the leading codeword;

a length lookup table to provide the bit number of the leading codeword;

a barrel shifter configured to perform a bitwise shift operation on the received decoding bitstream by the bit number of the leading codeword to output the decoding bitstream excluding the leading codeword; and an adder configured to calculate a next used length for the next decoding process by accumulating the bit number of the leading codeword, the next used length corresponding to a number of used bits during the current decoding process.

9. The variable-length decoder of claim 6, wherein a number of the baseline decoding units corresponds to a number of the plurality of symbols per clock cycle.

10. A method of variable-length decoding comprising:

generating a decoding bitstream for a current decoding process based on an unused bitstream and an input bitstream, the unused bitstream including unused bits of a previous decoding bitstream;

generating a plurality of symbols per clock cycle based on the decoding bitstream; and providing a next unused bitstream for a next decoding process, the next unused bitstream including unused bits of the decoding bitstream.

11. The method of claim 10, wherein generating the decoding bitstream comprises:

receiving new bits of a used length from the input bitstream; and combining the unused bits of the previous decoding bitstream and the new bits to generate the decoding bitstream, the used length corresponding to a number of used bits of the previous decoding bitstream.

12. The method of claim 10, wherein generating the plurality of symbols comprises, sequentially generating each of the symbols by a unit of a codeword.

13. A video decoder comprising:

an inverse quantization unit configured to perform an inverse quantization operation on video data to generate a conversion coefficient;

an inverse conversion unit configured to perform an inverse conversion operation on the conversion coefficient to generate a residual frame;

a motion compensator configured generate a reconstructed video frame based on a reference frame and motion vectors; and a variable-length decoder configured to perform a variable-length decoding process on a bitstream to generate the video data and the motion vectors, the variable-length decoder comprising, a bitstream interface unit configured to generate a decoding bitstream for a current decoding process based on an unused bitstream and an input bitstream, the unused bitstream including unused bits of a previous decoding bitstream, and a decoding unit configured to decode the decoding bitstream to generate a plurality of symbols per clock cycle, and configured to provide a next unused bitstream for a next decoding process to the bitstream interface unit.

14. The video decoder of claim 13, wherein the bitstream interface unit is configured to receive new bits of a used length from the input bitstream, and configured to combine the unused bits of the previous decoding bitstream and the new bits to generate the decoding bitstream, the used length corresponding to a number of used bits of the previous decoding bitstream.

15. The video decoder of claim 14, wherein the bitstream interface unit comprises:

a first input register configured to store the input bitstream;

a first barrel shifter configured to perform a bitwise shift operation on the input bitstream to provide the new bits;

an unused bitstream register configured to store the unused bitstream; and a logic circuit configured to generate the decoding bitstream based on an output of the unused bitstream register and an output of the first barrel shifter.

16. The video decoder of claim 15, wherein the bitstream interface unit further comprises:

a second barrel shifter configured to receive the input bitstream from the first input register when the first input register receives a new input bitstream, and configured to perform a bitwise shift operation on the input bitstream to provide is the unused bits; and a second input register configured to store an output of the second barrel shifter, and wherein the logic circuit is configured to generate the decoding bitstream based on an additional output of the second input register.

17. The video decoder of claim 16, wherein the bitstream interface unit is configured to determine shift numbers of the first and second barrel shifters and a renewal timing of how often the first input register receives a new input bitstream, which is based on the used length.

18. The video decoder of claim 13, wherein the decoding unit comprises, a plurality of baseline decoding units coupled in series with each other.

19. The video decoder of claim 18, wherein each of the baseline decoding units is configured to receive the decoding bitstream including bits that are unused in a previous one of the baseline decoding units, configured to generate a symbol corresponding to a leading codeword of the received decoding bitstream, and configured to output a bit number of the leading codeword.

20. The video decoder of claim 19, wherein each of the baseline decoding units comprises:
   a code lookup table to provide the symbol corresponding to the leading codeword;
   a length lookup table to provide the bit number of the leading codeword;
   a barrel shifter configured to perform a bitwise shift operation on the received decoding bitstream by the bit number of the leading codeword to output the decoding bitstream excluding the leading codeword; and
   an adder configured to calculate a next used length for the next decoding process by accumulating the bit number of the leading codeword, the next used length corresponding to a number of used bits during the current decoding process.

21. The video decoder of claim 18, wherein a number of the baseline decoding units corresponds to a number of the plurality of symbols per clock cycle.

22. An image display system, comprising:
   a receiving unit configured to receive a contents program;
   a demultiplexer configured to select video data from the contents program;
   a video decoder configured to decode the video data to generate a reconstructed video frame based on a variable-length decoding algorithm, the video decoder comprising,
   a bitstream interface unit configured to generate a decoding bitstream for a current decoding process based on an unused bitstream and an input bitstream, the unused bitstream including unused bits of a previous decoding bitstream, and
   a decoding unit configured to decode the decoding bitstream to generate a plurality of symbols per clock cycle, and configured to provide a next unused bitstream for a next decoding process to the bitstream interface unit;
   an encoder configured to convert the reconstructed video frame into display data corresponding to the video frame; and
   a display device configured to display the display data.

23. The image display system of claim 22, wherein the bitstream interface unit is configured to receive new bits of a used length from the input bitstream, and configured to combine the unused bits of the previous decoding bitstream and the new bits to generate the decoding bitstream, the used length corresponding to a number of used bits of the previous decoding bitstream.

24. The image display system of claim 23, wherein the bitstream interface unit comprises:
   a first input register configured to store the input bitstream;
   a first barrel shifter configured to perform a bitwise shift operation on the input bitstream to provide the new bits;
   an unused bitstream register configured to store the unused bitstream; and
   a logic circuit configured to generate the decoding bitstream based on an output of the unused bitstream register and an output of the first barrel shifter.

25. The image display system of claim 24, wherein the bitstream interface unit further comprises:
   a second barrel shifter configured to receive the input bitstream from the first input register when the first input register receives a new input bitstream, and configured to perform a bitwise shift operation on the input bitstream to provide the unused bits; and
   a second input register configured to store an output of the second barrel shifter, and
   wherein the logic circuit is configured to generate the decoding bitstream based on an additional output of the second input register.

26. The image display system of claim 25, wherein the bitstream interface unit is configured to determine shift numbers of the first and second barrel shifters and a renewal timing of how often the first input register receives a new input bitstream, which is based on the used length.

27. The image display system of claim 22, wherein the decoding unit comprises, a plurality of baseline decoding units coupled in series with each other.

28. The image display system of claim 27, wherein each of the baseline decoding units is configured to receive the decoding bitstream including bits that are unused in a previous one of the baseline decoding units, configured to generate a symbol corresponding to a leading codeword of the received decoding bitstream, and configured to output a bit number of the leading codeword.

29. The image display system of claim 28, wherein each of the baseline decoding units comprises:
   a code lookup table to provide the symbol corresponding to the leading codeword;
   a length lookup table to provide the bit number of the leading codeword;
   a barrel shifter configured to perform a bitwise shift operation on the received decoding bitstream by the bit number of the leading codeword to output the decoding bitstream excluding the leading codeword; and
   an adder configured to calculate a next used length for the next decoding process by accumulating the bit number of the leading codewords, the next used length corresponding to a number of used bits during the current decoding process.

30. The image display system of claim 27, wherein a number of the baseline decoding units corresponds to a number of the plurality of symbols per clock cycle.

* * * * *